United States Patent
Hachimine

(10) Patent No.: US 7,737,495 B2
(45) Date of Patent: Jun. 15, 2010

(54) SEMICONDUCTOR DEVICE HAVING INTER-LAYERS WITH STRESS LEVELS CORRESPONDING TO THE TRANSISTOR TYPE

(75) Inventor: Kiyota Hachimine, Tokyo (JP)

(73) Assignee: Sony Corporation, Tokyo (JP)

( * ) Notice: Subject to any disclaimer, the term of this patent is extended or adjusted under 35 U.S.C. 154(b) by 178 days.

(21) Appl. No.: 11/382,563

(22) Filed: May 10, 2006

(65) Prior Publication Data
US 2006/0261416 A1    Nov. 23, 2006

(30) Foreign Application Priority Data
May 17, 2005    (JP)    ............... P2005-143471

(51) Int. Cl.
*H01L 29/78*    (2006.01)
(52) U.S. Cl. .............. 257/338; 257/351; 257/369; 257/E27.062
(58) Field of Classification Search ........... 257/338, 257/351, 369, E27.062; 438/199
See application file for complete search history.

(56) References Cited

U.S. PATENT DOCUMENTS

| | | | |
|---|---|---|---|
| 6,380,558 B1 * | 4/2002 | Yamazaki et al. ............ 257/57 |
| 6,395,587 B1 * | 5/2002 | Crowder et al. ............ 438/149 |
| 7,115,954 B2 * | 10/2006 | Shimizu et al. ............ 257/369 |
| 7,187,038 B2 * | 3/2007 | Morin et al. ............ 257/369 |
| 7,211,869 B2 * | 5/2007 | Chan et al. ............ 257/369 |
| 2003/0040158 A1 * | 2/2003 | Saitoh ............ 438/279 |
| 2004/0135234 A1 * | 7/2004 | Morin et al. ............ 257/635 |
| 2005/0130360 A1 * | 6/2005 | Zhan et al. ............ 438/197 |
| 2005/0247926 A1 * | 11/2005 | Sun et al. ............ 257/19 |
| 2008/0054366 A1 * | 3/2008 | Pidin ............ 257/371 |

FOREIGN PATENT DOCUMENTS

WO    WO02/43151    5/2002

* cited by examiner

*Primary Examiner*—Tuan N. Quach
(74) *Attorney, Agent, or Firm*—Sonnenschein Nath & Rosenthal LLP

(57) ABSTRACT

The present invention provides a semiconductor device including an N channel MIS type transistor and a P channel MIS type transistor. The semiconductor device includes a first inter-layer film formed on the NMIS transistor and having a tensile stress, and a second inter-layer film formed on the first inter-layer film and a PMIS transistor and having a compressive stress, and the compressive stress in the second inter-layer film is relaxed on the upper side of the first inter-layer film.

2 Claims, 9 Drawing Sheets

ION IMPLANTATION

FIG. 5A - PRIOR ART
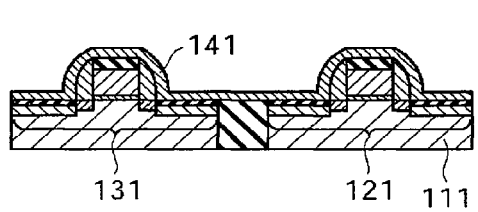
FIG. 5E - PRIOR ART
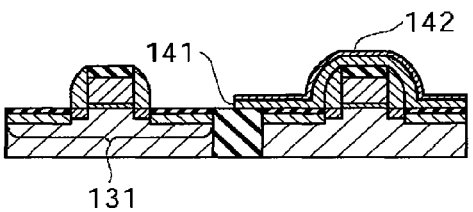
FIG. 5B - PRIOR ART
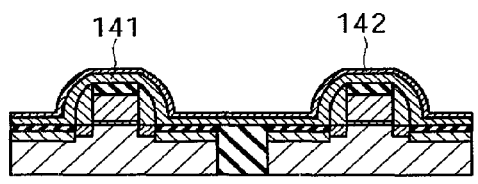
FIG. 5F - PRIOR ART
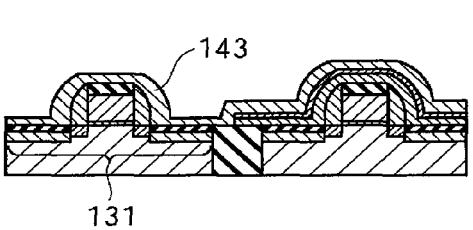
FIG. 5C - PRIOR ART
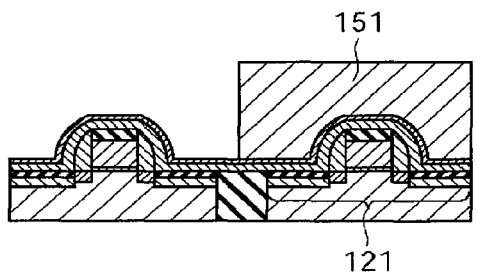
FIG. 5G
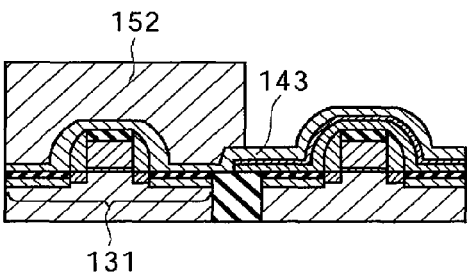
FIG. 5D - PRIOR ART
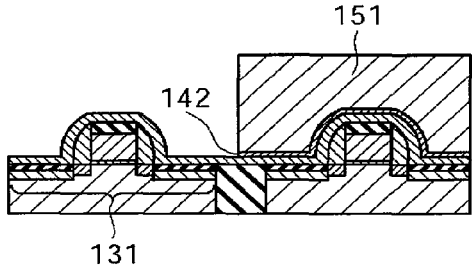
FIG. 5H - PRIOR ART
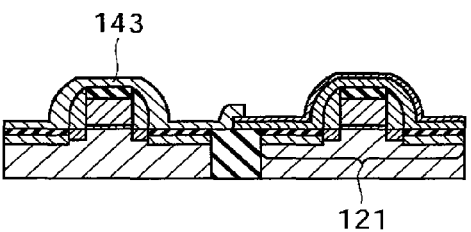

FIG. 6A - PRIOR ART
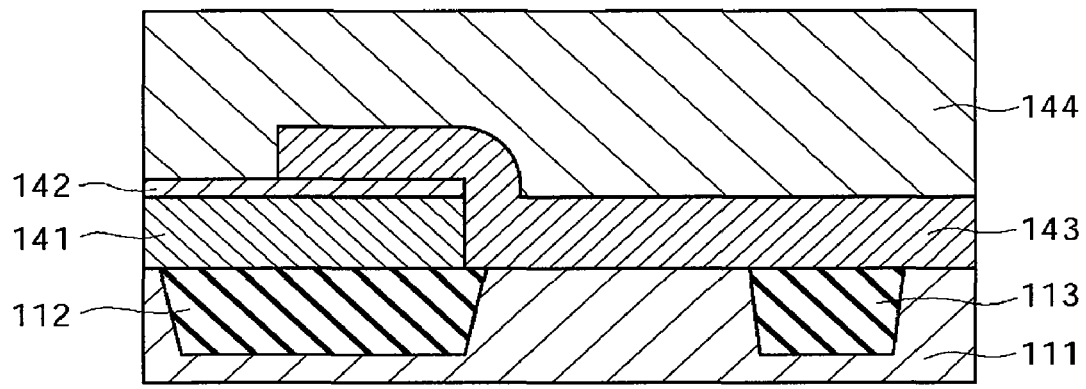
FIG. 6B - PRIOR ART
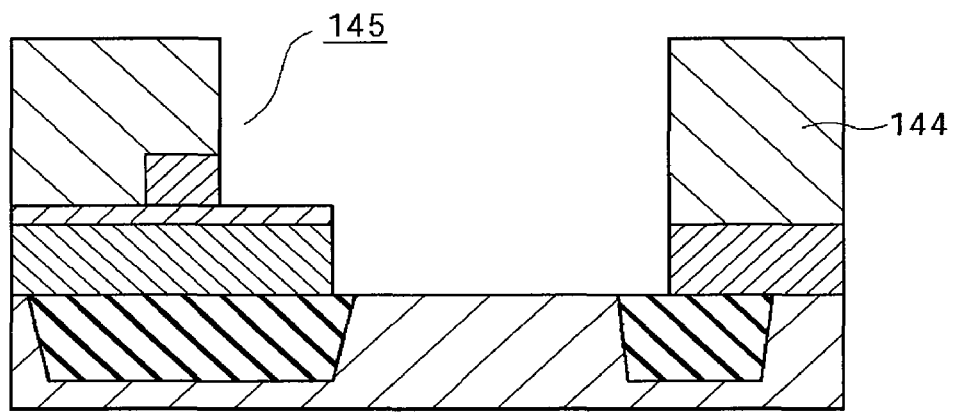
FIG. 6C - PRIOR ART
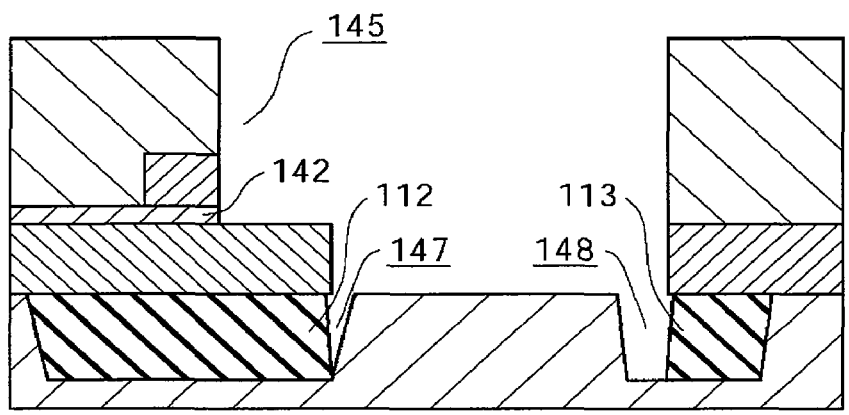

F I G . 7 A -PRIOR ART
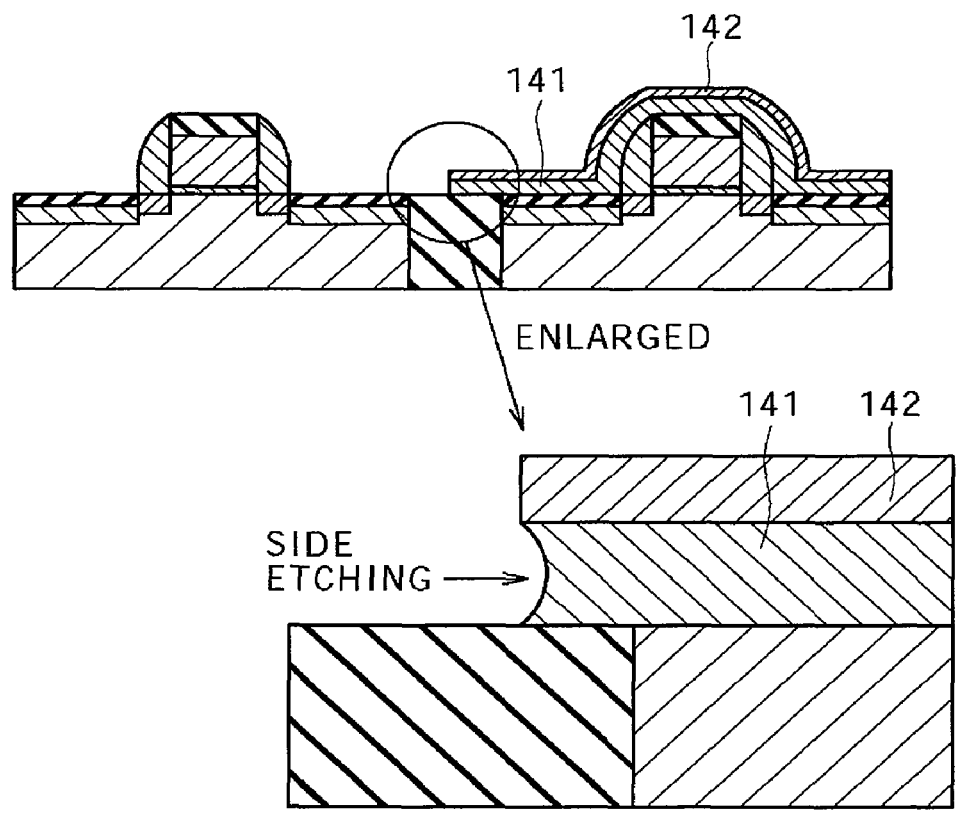
F I G . 7 B -PRIOR ART
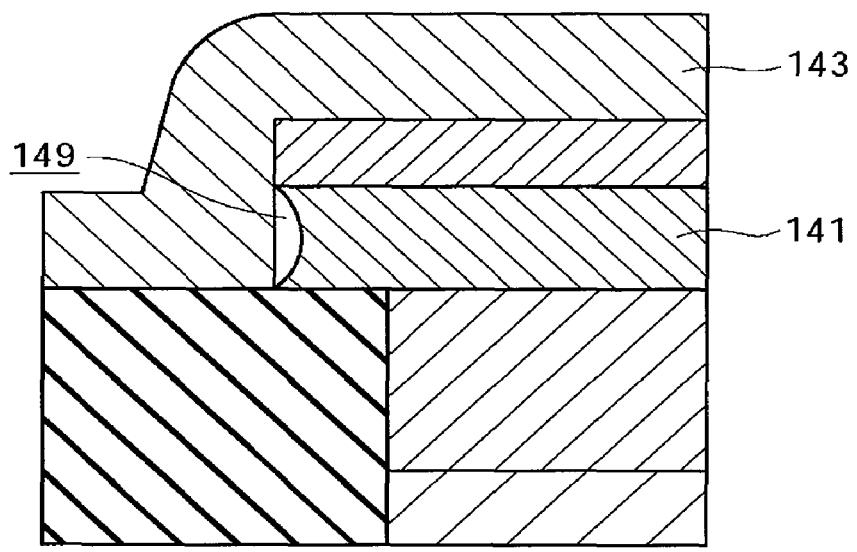

FIG. 8A - PRIOR ART
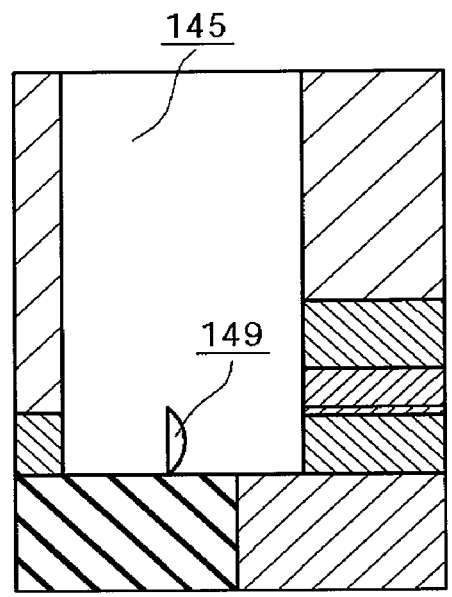
FIG. 8B - PRIOR ART
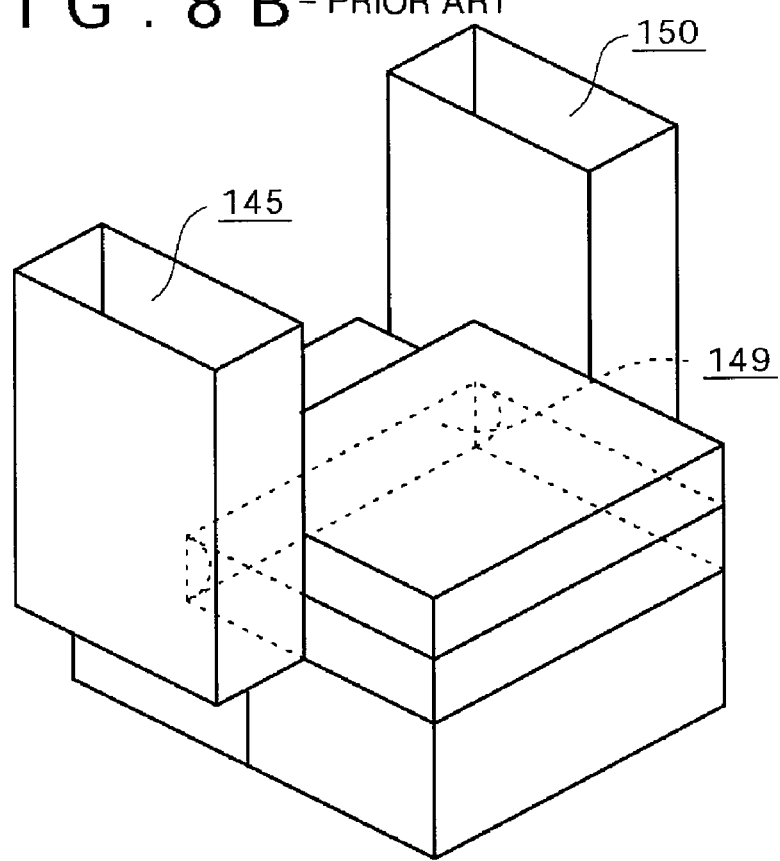

SEMICONDUCTOR DEVICE HAVING INTER-LAYERS WITH STRESS LEVELS CORRESPONDING TO THE TRANSISTOR TYPE

CROSS REFERENCES TO RELATED APPLICATIONS

The present invention contains subject matter related to Japanese Patent Application JP 2005-143471 filed in the Japanese Patent Office on May 17, 2005, the entire contents of which being incorporated herein by reference.

BACKGROUND OF THE INVENTION

The present invention relates to a semiconductor device, and a method of manufacturing the same. A tensile stress film is formed on an N channel MIS type transistor, and a compressive stress film is formed on a P channel MIS type transistor, whereby it is easy to contrive enhancement of the current drive performance of both the transistors.

Enhancement of the performance of MIS type transistors has been conducted by miniaturization of a gate or the like. However, it is presumed that enhancing the performance by miniaturization has its limitation, and search for a break-through technology superior to the miniaturization technology has come to be vigorously made at present. One of the candidates for the break-through technology is a technology in which the stress in a channel portion is varied by utilizing the stress in a silicon nitride (SiN) inter-layer film, so as to enhance the current drive performance.

It is known that the current drive performance of an N channel MIS type transistor is enhanced by forming a silicon nitride (SiN) film having a tensile stress. It is known, on the other hand, that the current drive performance is degraded when a silicon nitride (SiN) film having a compressive stress is formed. In addition, it is known that the current drive performance of a P channel MIS type transistor is enhanced by forming a silicon nitride (SiN) film having a compressive stress. On the other hand, the current drive performance is known to be degraded when a silicon nitride (SiN) film having a tensile stress is formed. Thus, both of the compressive stress film and the tensile stress film are in a trade-off relationship as to the P channel type transistor and the N channel type transistor.

Accordingly, in order to simultaneously enhance the current drive performance of an N channel MIS type transistor and the current drive performance of a P channel MIS type transistor, it may be necessary to produce a structure in which a silicon nitride (SiN) film having a tensile stress is formed on the N channel MIS type transistor, while a silicon nitride (SiN) film having a compressive stress is formed on the P channel MIS type transistor.

Here, one example of the method of producing the above-mentioned structure in the related art (see, for example, Re-published PCT Patent (A1) WO 02/043151) will be described below, referring to FIGS. 5A to 5H.

As shown in FIG. 5A, a silicon substrate 111 is formed with an N channel MIS type transistor (hereinafter referred to as NMIS transistor) 121 and a P channel MIS type transistor (hereinafter referred to as PMIS transistor) 131. Thereafter, a first inter-layer film 141 composed of a silicon nitride (SiN) film having a tensile stress is formed by a thermal CVD process or a plasma CVD process. In this instance, the stress possessed by the first inter-layer film 141 is regulated by the film forming conditions such as the film forming temperature, the pressure of the film forming atmosphere, etc. It is known that, when a inter-layer film having a stress is thus formed, the stress in a channel portion of each MIS type transistor is influenced by the stress and the thickness of the inter-layer film and the structure of the MIS type transistor (see, for example, Re-published PCT Patent (A1) WO 02/043151).

Next, as shown in FIG. 5B, a silicon oxide (SiO2) film 142 is formed on the first inter-layer film 141 having the tensile stress. This film 142 serves as a stopper film for preventing the first inter-layer film 141 having the tensile stress from being etched when a second inter-layer film having a compressive stress on the NMIS transistor 121 will later be removed by dry etching.

Subsequently, as shown in FIG. 5C, the NMIS transistor 121 is covered with a resist pattern 151 by a lithography process.

Next, as shown in FIG. 5D, using the resist pattern 151, the silicon oxide film 142 on the PMIS transistor 131 is removed by dry etching. Thereafter, the resist pattern 151 is removed. The removal of the resist pattern 151 is carried out, for example, by an asher process.

Subsequently, as shown in FIG. 5E, using the silicon oxide film 142 as a hard mask, the first inter-layer film 141 having the tensile stress on the PMIS transistor 131 is removed by dry etching.

Next, as shown in FIG. 5F, the second inter-layer film 143 having a compressive stress is formed so as to cover the whole surface on the side of the PMIS transistor 131, by a thermal CVD process or a plasma CVD process. The second inter-layer film 143 is composed, for example, of a silicon nitride (SiN) film having a compressive stress. In this instance, the stress possessed by the second inter-layer film 143 is controlled by the film forming conditions such as the film forming temperature, the pressure of the film forming atmosphere, etc.

Subsequently, as shown in FIG. 5G, the PMIS transistor 131 is covered with a resist pattern 152 by a lithography process. In this case, for enhancing the adhesion of the resist to the under film, a silicon oxide (SiO2) film (not shown) having a thickness of several nanometers may be formed on the second inter-layer film 143 having the compressive stress, or the surface of the second inter-layer film 143 may be oxidized by an ashing treatment.

Next, as shown in FIG. 5H, using the resist pattern 152 [see FIG. 5G], the second inter-layer film 143 having the compressive stress on the NMIS transistor 121 is removed by dry etching.

SUMMARY OF THE INVENTION

There are various problems yet to be solved, as follows.

As shown in FIG. 6A, buried oxide films 112 and 113 to be device isolation regions in an STI (Shallow Trench Isolation) structure are formed in a silicon substrate 111, a first inter-layer film 141 having a tensile stress is formed on the silicon substrate 111, and a silicon oxide film 142 is formed on the first inter-layer film 141. In addition, a second inter-layer film 143 having a compressive stress is formed in the state of covering the area between the buried oxide films 112 and 113, and a part of the second inter-layer film 143 is formed on the upper side of the first inter-layer film 141 having the tensile stress and the silicon oxide film 142. Further, a layer insulation film 144 is provided on the upper side of the silicon substrate 111 so as to cover the first inter-layer film 141 and the second inter-layer film 143.

As shown in FIG. 6B, a contact hole 145 is formed in the layer insulation film 144.

In this case, as shown in FIG. 6C, when the silicon oxide film 142 on the first inter-layer film 141 having the tensile stress which is present at a bottom portion of the contact hole 145 is removed, the buried oxide films 112 and 113 exposed at bottom portions of the contact hole 145 are also etched partly, whereby slits 147 and 148 are formed. This causes the problem that the coverage of a barrier layer (not shown) formed later on the inside surface of the contact hole 145 is degraded, resulting in poor reliability of wiring. Besides, there is also the problem that, where the contact hole is formed on the upper side of the slits 147, 148, short-circuiting with the silicon substrate would be caused.

In addition, as shown in FIG. 7A, when the first inter-layer film 141 having the tensile stress is etched, the etching selectivity ratio between the first inter-layer film 141 and the silicon oxide film 142 serving as a stopper causes the end portion of the first inter-layer film 141 having the tensile stress to recede from the end portion of the silicon oxide film 142, namely, causes the so-called side etching.

Thereafter, where a second inter-layer film 143 having a compressive stress is formed on the first inter-layer film 141 having the tensile stress, as shown in FIG. 7B, a gap 149 would be generated between the end portion of the first inter-layer film 141 having the tensile stress and the second inter-layer film 143 having the compressive stress.

Then, where contact holes 145 and 150 are formed with the gap 149 therebetween, as shown in FIGS. 8A and 8B, the contact hole 145 and the contact hole 150 would be communicated with each other. Therefore, when the contact holes 145 and 150 are filled up with a conductive material, the gap 149 is also filled up with the conductive material, causing a short-circuit between the contact holes 145 and 150, and making it difficult to secure reliability of wiring.

Thus, there is a need to obviate excessive etching of a device isolation region, to prevent short-circuiting from occurring between contact holes, and to secure reliability of wiring.

According to an embodiment of the present invention, a first semiconductor device includes an N channel MIS type transistor and a P channel MIS type transistor. The semiconductor device includes a first inter-layer film formed on the N channel MIS type transistor and having a tensile stress, and a second inter-layer film formed on the first inter-layer film and the P channel MIS type transistor and having a compressive stress, and the compressive stress in the second inter-layer film is relaxed on the upper side of the first inter-layer film.

In the first semiconductor device, a stopper film used in the related art is not provided between the first inter-layer film having a tensile stress and the second inter-layer film having a compressive stress, so that the problems which arose from the stopper film in the related art are not generated. In addition, since the first inter-layer film having a tensile stress is formed on the N channel MIS type transistor, the current drive performance of the N channel MIS type transistor is enhanced. Besides, since the second inter-layer film having a compressive stress is formed on the P channel MIS type transistor, the current drive performance of the P channel MIS type transistor is enhanced. Incidentally, the second inter-layer film having the compressive force is formed also on the first inter-layer film having the tensile stress, but, since the compressive stress in the second inter-layer film is relaxed on the upper side of the first inter-layer film, the N channel MIS type transistor is substantially covered with a tensile stress film. Therefore, the above-mentioned effects can be obtained.

According to another embodiment of the present invention, a second semiconductor device includes an N channel MIS type transistor and a P channel MIS type transistor. The semiconductor device includes a first inter-layer film formed on the P channel MIS type insulation film and having a compressive stress, and a second inter-layer film formed on the first inter-layer film and the N channel MIS type transistor and having a tensile stress, and the tensile stress in the second inter-layer film is relaxed on the upper side of the P channel MIS type transistor.

In the second semiconductor device, a stopper film used in the related art is not provided between the first inter-layer film having a compressive force and the second inter-layer film having a tensile stress, so that the problems which arose from the stopper film in the related art are not generated. In addition, since the first inter-layer film having a compressive stress is formed on the P channel MIS type transistor, the current drive performance of the P channel MIS type transistor is enhanced. Besides, since the second inter-layer film having a tensile stress is formed on the N channel MIS type transistor, the current drive performance of the N channel MIS type transistor is enhanced. Incidentally, the second inter-layer film having the tensile stress is formed also on the first inter-layer film having the compressive stress, but, since the tensile stress in the second inter-layer film is relaxed on the upper side of the first inter-layer film, the P channel MIS type transistor is substantially covered with a compressive stress film. Therefore, the above-mentioned effects can be obtained.

According to a further embodiment of the present invention, a first method of manufacturing a semiconductor device includes the steps of: forming an N channel MIS type transistor and a P channel MIS type transistor, and thereafter forming a first inter-layer film covering the N channel MIS type transistor and having a tensile stress; forming a second inter-layer film having a compressive stress so as to cover the first inter-layer film and the P channel MIS type transistor; and relaxing the compressive stress in the second inter-layer film on the upper side of the first inter-layer film.

In the first method of manufacturing a semiconductor device, it is unnecessary to provide a stopper film between the first inter-layer film having a tensile stress and the second inter-layer film having a compressive stress, so that the problems which arose from the stopper film in the related art are not generated. In addition, since the first inter-layer film having a tensile stress is formed on the N channel MIS type transistor and thereafter the compressive stress in the second inter-layer film having the compressive stress is relaxed on the upper side of the first inter-layer film on the N channel MIS type transistor, the stress film(s) on the N channel MIS type transistor is substantially a tensile stress film. Therefore, the current drive performance of the N channel MIS type transistor is enhanced. Besides, since the second inter-layer film having the compressive stress is formed on the P channel MIS type transistor, the current drive performance of the P channel MIS type transistor is enhanced.

According to yet another embodiment of the present invention, a second method of manufacturing a semiconductor device, includes the steps of: forming an N channel MIS type transistor and a P channel MIS type transistor, and thereafter forming a first inter-layer film covering the P channel MIS type transistor and having a compressive stress; forming a second insulation film having a tensile stress so as to cover the first inter-layer film and the N channel MIS type transistor; and relaxing the tensile stress in the second inter-layer film on the upper side of the first inter-layer film.

In the second method of manufacturing a semiconductor device, it is unnecessary to provide a stopper film between the first inter-layer film having a compressive stress and the second inter-layer film having a tensile stress, so that the problems which arose from the stopper film in the related art are not generated. In addition, since the first inter-layer film having a compressive force is formed on the P channel MIS type transistor and thereafter the tensile stress in the second inter-layer film having the tensile stress is relaxed on the upper side of the first inter-layer film on the P channel MIS type transistor, the stress film(s) on the P channel MIS type transistor is substantially a compressive stress film. Therefore, the current drive performance of the P channel MIS type transistor is enhanced. Besides, since the second inter-layer film having the tensile stress is formed on the N channel MIS type transistor, the current drive performance of the N channel MIS type transistor is enhanced.

In the first semiconductor device, a stopper film used in the related art is not provided between the first inter-layer film having a tensile stress and the second inter-layer film having a compressive stress, so that the problems arose from the stopper film in the related art are not generated. Therefore, where a layer insulation film is formed on the first inter-layer film having the tensile stress and the second inter-layer film having the compressive stress and contact holes are formed in the layer insulation film, the contact holes show high reliability of wiring. Besides, since the first inter-layer film having the tensile stress and the second inter-layer film with its stress relaxed are formed on the N channel MIS type transistor, it can be said that an inter-layer film having a tensile stress is substantially formed on the N channel MIS type transistor. On the other hand, the second inter-layer film having a compressive stress is formed on the P channel MIS type transistor. Therefore, there is obtained the merit that the current drive performance of each of the MIS type transistors can be enhanced.

In the second semiconductor device, a stopper film used in the related art is not provided between the first inter-layer film having a compressive stress and the second inter-layer film having a tensile stress, so that the problems which arose from the stopper film in the related art are not generated. Therefore, where a layer insulation film is formed on the first inter-layer film having the compressive stress and the second inter-layer film having the tensile stress and contact holes are formed in the layer insulation film, the contact holes show high reliability of wiring. In addition, the second inter-layer film having a tensile stress is formed on the N channel MIS type transistor, whereas the first inter-layer film having a compressive stress and the second inter-layer film with its stress relaxed are formed on the P channel MIS type transistor, so that it can be said that an inter-layer film having a compressive stress is substantially formed on the P channel MIS type transistor. Therefore, there is obtained the advantage that the current drive performance of each of the MIS type transistors can be enhanced.

In the first method of manufacturing a semiconductor device, a stopper film used in the related art is not provided between the first inter-layer film having a tensile stress and the second inter-layer film having a compressive stress, so that the problems which arose from the stopper film in the related art are not generated. Therefore, where a layer insulation film is formed on the first inter-layer film having the tensile stress and the second inter-layer film having the compressive stress and contact holes are formed in the layer insulation film, the contact holes showing high reliability of wiring can be formed. Besides, while the first inter-layer film having a tensile stress and the second inter-layer film having a compressive stress are formed on the N channel MIS type transistor, the stress in the second inter-layer film is relaxed. Therefore, an inter-layer film having a tensile stress is substantially formed on the N channel MIS type transistor. On the other hand, the second inter-layer film having a compressive stress is formed on the P channel MIS type transistor. Therefore, there is obtained the merit that the current drive performance of each of the MIS type transistors can be enhanced. Moreover, there is the advantage that, for carrying out the steps of forming the stress films, it suffices to form two different stress films.

In the second method of manufacturing a semiconductor device, a stopper film used in the related art is not provided between the first inter-layer film having a compressive stress and the second inter-layer film having a tensile stress, so that the problems which arose from the stopper film in the related art are not generated. Therefore, where a layer insulation film is formed on the first inter-layer film having the compressive stress and the second inter-layer film having the tensile stress and contact holes are formed in the layer insulation film, the contact holes with high reliability of wiring can be formed. In addition, while the first inter-layer film having a compressive stress and the second inter-layer film having a tensile stress are formed on the P channel MIS type transistor, the tensile stress in the second inter-layer film is relaxed on the upper side of the first inter-layer film. Therefore, an inter-layer film with a compressive stress is substantially formed on the P channel MIS type transistor. On the other hand, the second inter-layer film having a tensile stress is formed on the N channel MIS type transistor. Therefore, there is obtained the advantage that the current drive performance of each of the MIS type transistors can be enhanced. Moreover, there is the merit that, for carrying out the steps of forming the stress films, it suffices to form two different stress films.

BRIEF DESCRIPTION OF THE DRAWINGS

FIGS. 5A to 5H are manufacturing step sectional diagrams showing one embodiment of the related art;

FIGS. 6A to 6C are diagrams showing a problem encountered in the related art;

FIGS. 7A and 7B are diagrams showing a problem encountered in the related art; and FIGS. 8A and 8B are diagrams showing the problem encountered in the related art.

DETAILED DESCRIPTION OF THE PREFERRED EMBODIMENTS

In order to enhance reliability of wiring and to enhance the current drive performance of each of MIS type transistors, a tensile stress film is formed on an NMIS transistor, thereafter a compressive stress film is formed over the whole surface inclusive of the region of a PMIS transistor, and then the stress in the compressive stress film is relaxed on the upper side of the NMIS transistor, resulting in the condition where a tensile stress film is substantially formed on the NMIS transistor. By this, a higher current drive performance of each MIS type transistor and a higher reliability of wiring are realized, without forming a stopper film like the one used in the related art.

Now, a first embodiment of the semiconductor device in the present invention will be described below, referring to the schematic configurational sectional diagram shown in FIG. 1.

Figure 1:
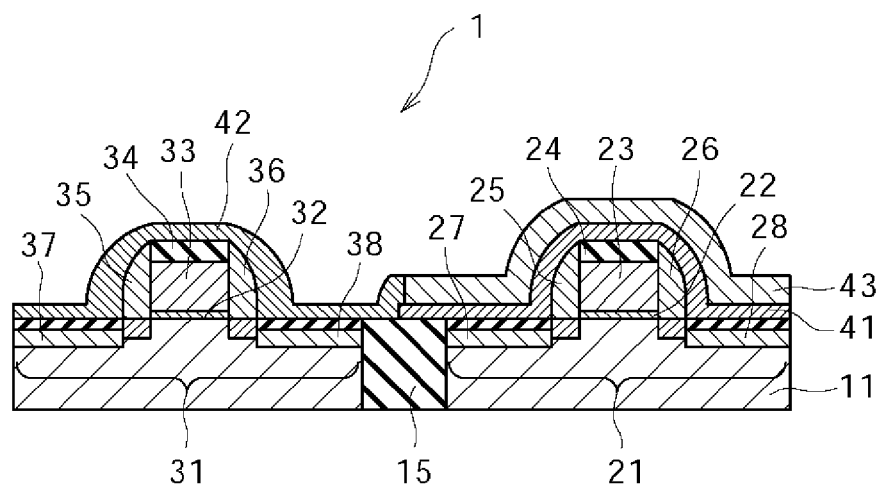
FIG. 1 is a schematic configurational sectional diagram showing a first embodiment of the semiconductor device in the present invention.

As shown in FIG. 1, a semiconductor substrate (e.g., a silicon substrate) 11 is formed with an N channel MIS type transistor (hereinafter referred to as NMIS transistor) 21 and a P channel MIS type transistor (hereinafter referred to as PMIS transistor) 31, which are isolated from each other by a device isolation region 15.

The NMIS transistor 21 has a configuration as follows. A gate electrode 23 is formed on the upper side of the semiconductor substrate 11, by way of a gate insulation film 22 therebetween, and side wall spacers 25 and 26 are formed on both lateral sides of the gate electrode 23. Incidentally, a silicide layer 24 is formed on the gate electrode 23. Besides, in order that the region of the semiconductor substrate 11 directly below the gate electrode 23 becomes a channel forming region, source/drain regions 27 and 28 composed of N type regions are formed in the semiconductor substrate 11 on both lateral sides of the channel forming region. Incidentally, an extension structure may be adopted in which the regions directly below the side wall spacers 25 and 26 become N type regions of shallower junction than that of the source/drain regions 27 and 28.

The PMIS transistor 31 has a configuration as follows. A gate electrode 33 is formed on the upper side of the semiconductor substrate 11, by way of a gate insulation film 32 therebetween, and side wall spacers 35 and 36 are formed on both lateral sides of the gate electrode 33. Incidentally, a silicide layer 34 is formed on the gate electrode 33. Besides, in order that the region of the semiconductor substrate 11 directly below the gate electrode 33 becomes a channel forming region, source/drain regions 37 and 38 composed of P type regions are formed in the semiconductor substrate 11 on both lateral sides of the channel forming region. Incidentally, an extension structure may be adopted in which the regions directly below the side wall spacers 35 and 36 become P type regions of shallower junction than that of the source/drain regions 37 and 38.

A first inter-layer film 41 having a tensile stress is formed on the region where the NMIS transistor 21 is formed. The first inter-layer film 41 having a tensile stress is composed of a silicon nitride (SiN) film formed, for example, by a thermal CVD process or a plasma CVD process, with the tensile stress regulated by the film forming conditions such as the film forming temperature, the pressure of the film forming atmosphere, etc. As the first inter-layer film 41 is thicker, the current drive performance can be enhanced more. If the film is too thick, however, side effects would be generated such as difficulty in processing for forming contact holes. Therefore, the thickness of the first inter-layer film 41 is desirably in the range of 50 to 100 nm, for example.

A second inter-layer film 42 having a compressive stress is formed on the region where the PMIS transistor 31 is formed. The second inter-layer film 42 having a compressive stress is composed of a silicon nitride (SiN) film formed, for example, by a thermal CVD process or a plasma CVD process, with the compressive stress regulated by the film forming conditions such as the film forming temperature, the pressure of the film forming atmosphere, etc. As the second inter-layer film 42 is thicker, the current drive performance can be enhanced more. If the film is too thick, however, side effects would be generated such as difficulty in processing for forming contact holes. Therefore, the thickness of the second inter-layer film 42 is desirably in the range of 50 to 100 nm, for example.

In addition, the second inter-layer film 42 is formed also on the first inter-layer film 41 having the tensile stress which is formed over the NMIS transistor 21. The second inter-layer film 42 formed over the NMIS transistor 21 and over the PMIS transistor 31 is composed of a continuous single layer. However, the second inter-layer film 42 present on the first inter-layer film 41 is a second inter-layer film 43 with its stress relaxed to 0 or nearly to 0. Therefore, the resultant stress of the stress in the first inter-layer film 41 and the stress in the stress-relaxed second inter-layer film 43 is a tensile stress.

Accordingly, in the semiconductor device 1 as above, the first inter-layer film 41 having the tensile stress and the stress-relaxed second inter-layer film 43 are formed over the NMIS transistor 21, while the second inter-layer film 42 having the compressive stress is formed over the PMIS transistor 31. Incidentally, it is the most preferable that the stress-relaxed second inter-layer film 43 is a film in which the stress is 0, it suffices that the combination of the first inter-layer film 41 and the stress-relaxed second inter-layer film 43 thereon is substantially a film having a tensile stress.

Though not shown in the figure, a layer insulation film is formed on the stress-relaxed second inter-layer film 43 and the second inter-layer film 42 having the compressive stress, and the layer insulation film is provided therein with contact holes 45 communicated with the gate electrode 23 and the source/drain regions 27, 28 of the NMIS transistor 21, and the gate electrode 33 and the source/drain regions 37, 38 of the PMIS transistor 31.

In the first semiconductor device 1 as above, a stopper film used in the related art is not provided between the first inter-layer film 41 having a tensile stress and the second inter-layer film 42 having a compressive stress, so that the problems which arose from the stopper film are not generated. Therefore, where the layer insulation film (not shown) is formed on the first inter-layer film 41 having the tensile stress and the second inter-layer film 42 having the compressive stress and the contact holes (not shown) are formed in the layer insulation film, the contact holes show high reliability of wiring. In addition, since the second inter-layer film 42 having a compressive stress is formed over the P channel MIS type transistor 31, the current drive performance of the P channel MIS type transistor 31 is enhanced. Besides, since the first inter-layer film 41 having a tensile stress and the stress-relaxed second inter-layer film 43 are formed over the N channel MIS type transistor 21, an inter-layer film having a tensile stress is substantially formed over the N channel MIS type transistor 21, so that the current drive performance of the N channel MIS type transistor 21 is enhanced.

Now, a second embodiment of the semiconductor device in the present invention will be described below, referring to the schematic configurational sectional diagram shown in FIG. 2.

Figure 2:
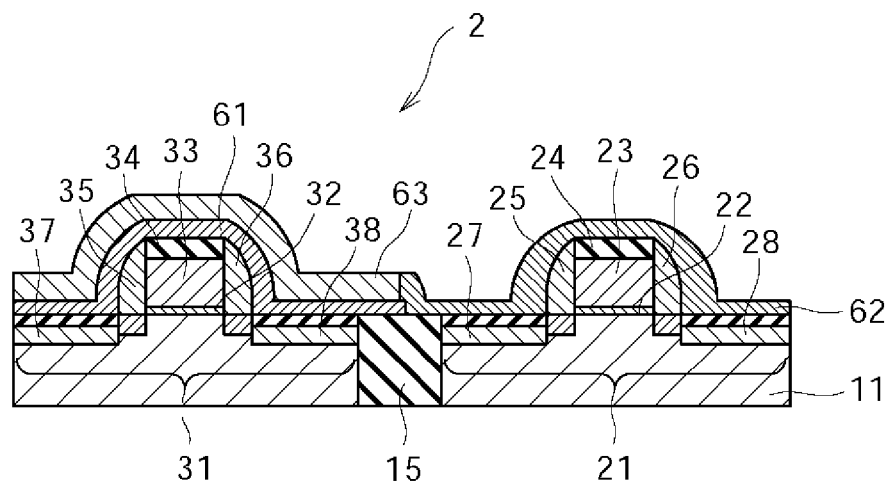
FIG. 2 is a schematic configurational sectional diagram showing a second embodiment of the semiconductor device in the present invention.

As shown in FIG. 2, a semiconductor substrate (e.g., a silicon substrate) 11 is formed with an N channel MIS type transistor (hereinafter referred to as NMIS transistor) 21 and a P channel MIS type transistor (hereinafter referred to as PMIS transistor) 31, which are isolated from each other by a device isolation region 15.

The NMIS transistor 21 has a configuration as follows. A gate electrode 23 is formed on the upper side of the semiconductor substrate 11, by way of a gate insulation film 22 therebetween, and side wall spacers 25 and 26 are formed on both lateral sides of the gate electrode 23. Incidentally, a silicide layer 24 is formed on the gate electrode 23. Besides, in order that the region of the semiconductor substrate 11 directly below the gate electrode 23 becomes a channel forming region, source/drain regions 27 and 28 composed of N type regions are formed in the semiconductor substrate 11 on both lateral sides of the channel forming region. Incidentally, an extension structure may be adopted in which the regions directly below the side wall spacers 25 and 26 become N type regions of shallower junction than that of the source/drain regions 27 and 28.

The PMIS transistor 31 has a configuration as follows. A gate electrode 33 is formed on the upper side of the semiconductor substrate 11, by way of a gate insulation film 32 therebetween, and side wall spacers 35 and 36 are formed on both lateral sides of the gate electrode 33. Incidentally, a silicide layer 34 is formed on the gate electrode 33. Besides, in order that the region of the semiconductor substrate 11 directly below the gate electrode 33 becomes a channel forming region, source/drain regions 37 and 38 composed of P type regions are formed in the semiconductor substrate 11 on both lateral sides of the channel forming region. Incidentally, an extension structure may be adopted in which the regions directly below the side wall spacers 35 and 36 become P type regions of shallower junction than that of the source/drain regions 37 and 38.

A first inter-layer film 61 having a compressive stress is formed on the region where the PMIS transistor 31 is formed. The first inter-layer film 61 having a compressive stress is composed of a silicon nitride (SiN) film formed, for example, by a thermal CVD process or a plasma CVD process, with the compressive stress regulated by the film forming conditions such as the film forming temperature, the pressure of the film forming atmosphere, etc. As the first inter-layer film 61 is thicker, the current drive performance can be enhanced more. If the film is too thick, however, side effects would be generated such as difficulty in processing for forming contact holes. Therefore, the thickness of the first inter-layer film 61 is desirably in the range of 50 to 100 nm, for example.

A second inter-layer film 62 having a tensile stress is formed on the region where the PMIS transistor 21 is formed. The second inter-layer film 62 having a tensile stress is composed of a silicon nitride (SiN) film formed, for example, by a thermal CVD process or a plasma CVD process, with the tensile stress regulated by the film forming conditions such as the film forming temperature, the pressure of the film forming atmosphere, etc. As the second inter-layer film 62 is thicker, the current drive performance can be enhanced more. If the film is too thick, however, side effects would be generated such as difficulty in processing for forming contact holes. Therefore, the thickness of the second inter-layer film 62 is desirably in the range of 50 to 100 nm, for example.

In addition, the second inter-layer film 62 is formed also on the first inter-layer film 61 having the compressive stress which is formed over the PMIS transistor 31. The second inter-layer film 62 formed over the NMIS transistor 21 and over the PMIS transistor 31 is composed of a continuous single layer. However, the second inter-layer film 62 present on the first inter-layer film 61 is a second inter-layer film 63 with its stress relaxed to 0 or nearly to 0. Therefore, the resultant stress of the stress in the first inter-layer film 61 and the stress in the stress-relaxed second inter-layer film 63 is a compressive stress.

Accordingly, in the semiconductor device 2 as above, the first inter-layer film 61 having the compressive stress and the stress-relaxed second inter-layer film 63 are formed over the PMIS transistor 31, while the second inter-layer film 62 having the tensile stress is formed over the NMIS transistor 21. Incidentally, it is the most preferable that the stress-relaxed second inter-layer film 63 is a film in which the stress is 0, it suffices that the combination of the first inter-layer film 61 and the stress-relaxed second inter-layer film 63 thereon is substantially a film having a compressive stress.

Though not shown in the figure, a layer insulation film is formed on the stress-relaxed second inter-layer film 63 and the second inter-layer film 62 having the tensile stress, and the layer insulation film is provided therein with contact holes 45 communicated with the gate electrode 23 and the source/drain regions 27, 28 of the NMIS transistor 21, and the gate electrode 33 and the source/drain regions 37, 38 of the PMIS transistor 31.

In the second semiconductor device 2 as above, a stopper film used in the related art is not provided between the first inter-layer film 61 having a compressive stress and the second inter-layer film 62 having a tensile stress, so that the problems which arose from the stopper film are not generated. Therefore, where the layer insulation film (not shown) is formed on the first inter-layer film 61 having the compressive stress and the second inter-layer film 62 having the tensile stress and the contact holes (not shown) are formed in the layer insulation film, the contact holes show high reliability of wiring. In addition, the second inter-layer film 62 having a tensile stress is formed over the N channel MIS type transistor 21, whereas the first inter-layer film 61 having a compressive stress and the stress-relaxed second inter-layer film 63 are formed over the P channel MIS type transistor 31, so that an inter-layer film having a compressive stress is substantially formed over the P channel MIS type transistor 31. Therefore, there is obtained the merit that the current drive performance of each of the MIS type transistors can be enhanced.

Now, a first embodiment of the method of manufacturing a semiconductor device in the present invention will be described below, referring to the manufacturing step sectional diagrams shown in FIGS. 3A to 3J. In FIGS. 3A to 3J, the manufacturing steps of the semiconductor device 1 described above referring to FIG. 1 are shown.

Figure 3A:
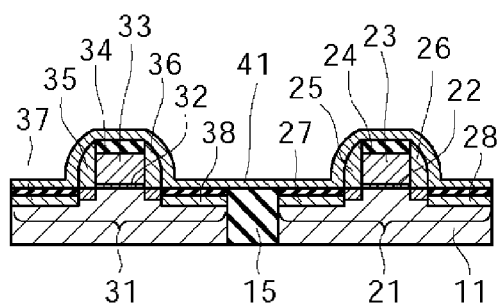
FIGS. 3A to 3J are manufacturing step sectional diagrams showing a first embodiment of the method of manufacturing a semiconductor device in the present invention.

As shown in FIG. 3A, by a transistor forming technology in related art, a semiconductor substrate (e.g., a silicon substrate) 11 is formed with an N channel MIS type transistor (hereinafter referred to as NMIS transistor) 21 and a P channel MIS type transistor (hereinafter referred to as PMIS transistor) 31, which are isolated from each other by a device isolation region 15.

The NMIS transistor 21 has a configuration as follows. A gate electrode 23 is formed on the upper side of the semiconductor substrate 11, by way of a gate insulation film 22 therebetween, and side wall spacers 25 and 26 are formed on both lateral sides of the gate electrode 23. Incidentally, a silicide layer 24 is formed on the gate electrode 23. Besides, in order that the region of the semiconductor substrate 11 directly below the gate electrode 23 becomes a channel forming region, source/drain regions 27 and 28 composed of N type regions are formed in the semiconductor substrate 11 on both lateral sides of the channel forming region. Incidentally, an extension structure may be adopted in which the regions directly below the side wall spacers 25 and 26 become N type regions of shallower junction than that of the source/drain regions 27 and 28.

The PMIS transistor 31 has a configuration as follows. A gate electrode 33 is formed on the upper side of the semiconductor substrate 11, by way of a gate insulation film 32 therebetween, and side wall spacers 35 and 36 are formed on both lateral sides of the gate electrode 33. Incidentally, a silicide layer 34 is formed on the gate electrode 33. Besides, in order that the region of the semiconductor substrate 11 directly below the gate electrode 33 becomes a channel forming region, source/drain regions 37 and 38 composed of P type regions are formed in the semiconductor substrate 11 on both lateral sides of the channel forming region. Incidentally, an extension structure may be adopted in which the regions directly below the side wall spacers 35 and 36 become P type regions of shallower junction than that of the source/drain regions 37 and 38.

Thereafter, by use of a thermal CVD process or a plasma CVD process, a first inter-layer film 41 having a tensile stress is formed. The first inter-layer film 41 having the tensile stress can be composed, for example, of a film containing silicon and nitrogen as main constituents; for instance, a silicon nitride (SiN) film is formed as the first inter-layer film 41 by a thermal CVD process or a plasma CVD process. In this case, the stress possessed by the first inter-layer film 41 is regulated by the film forming conditions such as the film forming temperature, the pressure of the film forming atmosphere, etc. In addition, the current drive performance can be enhanced more as the first inter-layer film 41 is thicker, but too large a film thickness causes side effects such as difficulty in processing for forming contact holes. Therefore, the thickness of the first inter-layer film 41 is desirably in the range of 50 to 100 nm, for example.

Figure 3E:
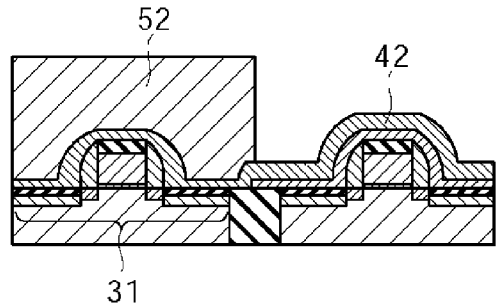
Figure 3B:
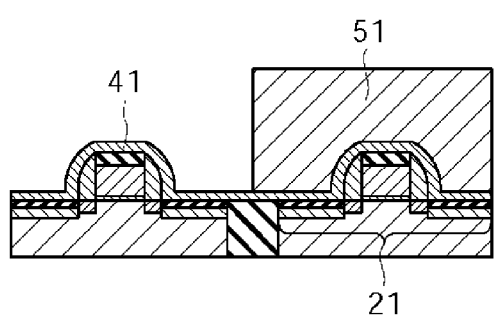

Next, as shown in FIG. 3B, a resist pattern 51 covering the NMIS transistor 21 is formed by a lithography process. Incidentally, where resist exfoliation or collapse or the like is generated under the influence of the under layer, an asher process may be conducted before the lithography process so as to oxidize the surface of the first inter-layer film 41 composed of silicon nitride.

Figure 3F:
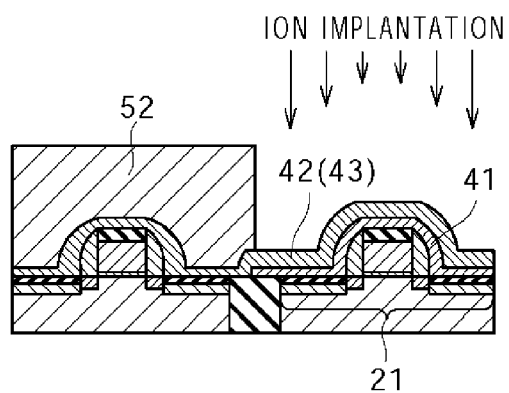
Figure 3C:
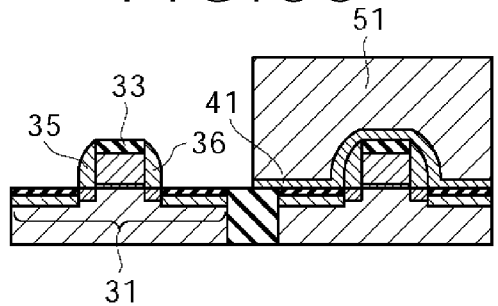

Subsequently, as shown in FIG. 3C, using the resist pattern 51 as an etching mask, the first inter-layer film 41 having a tensile stress present over the PMIS transistor 31 is removed. This removing process is carried out by dry etching, for example. In determining the conditions of the dry etching, it may be necessary to prevent the problem that the un-etched residue of the first inter-layer film 41 having the tensile stress might remain in the periphery of the side wall spacers 35 and 36 formed on side portions of the gate electrode 33 of the PMOS transistor 31, thereby possibly canceling the effects of a second inter-layer film having a compressive stress to be formed later. Therefore, it is desirable to select isotropic etching. Thereafter, the resist pattern 51 is removed. This removing process is carried out by an asher process using an oxygen plasma, for example.

Figure 3G:
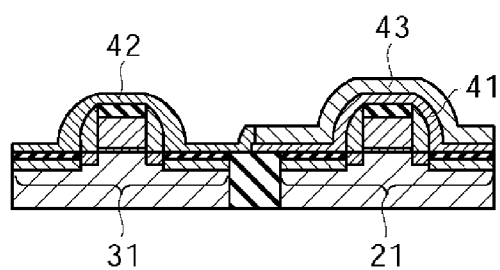
Figure 3D:
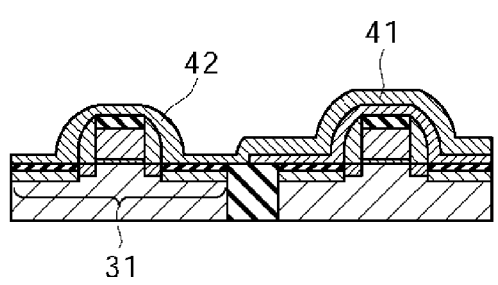

Next, as shown in FIG. 3D, by a thermal CVD process or a plasma CVD process, the second inter-layer film 42 having a compressive stress is formed so as to cover the whole surface on the side of the PMIS transistor 31. The second inter-layer film 42 can be composed, for example, of a film containing silicon and nitrogen as main constituents; for example, a silicon nitride (SiN) film having a compressive stress is formed as the second inter-layer film 42. In this case, the stress possessed by the second inter-layer film 42 is regulated by the film forming conditions such as the film forming temperature, the pressure of the film forming atmosphere, etc. In addition, like in the case of the first inter-layer film 41 having the tensile stress, the current drive performance can be enhanced more as the second inter-layer film 42 is thicker, but too large a film thickness causes side effects such as difficulty in processing for forming contact holes. Therefore, the thickness of the second inter-layer film 42 is desirably in the range of 50 to 100 nm, for example.

Subsequently, as shown in FIG. 3E, a resist pattern 52 covering the PMIS transistor 31 is formed by a lithography process. Incidentally, where resist exfoliation or collapse or the like is generated under the influences of the under layer, an asher process using an oxygen plasma may be conducted before the lithography process so as to oxidize the surface of the second inter-layer film 42 composed of silicon nitride.

Next, as shown in FIG. 3F, in order to relax the stress in the second inter-layer film 42 having the compressive stress present on the NMIS transistor 21, ion implantation is conducted by use of the resist pattern 52 as an ion implantation mask. Since the purpose of the ion implantation is to relax the stress in the second inter-layer film 42, as the ion species there can be used, for example, germanium (Ge) ion, silicon (Si) ion, and the like, in view of their great atomic weights and for suppressing the side effects upon their arrival on the semiconductor substrate 11. In addition, as for the ion implantation conditions, the implantation energy is controlled so that the depth at which the concentration of the ion species shows a peak is located in the second inter-layer film 42 to be stress relaxed. Besides, the dose of implantation is selected at such a level as to convert silicon (Si) into its amorphous state. For example, the dose is preferably not less than $1 \times 10^{-14}/cm^2$. The implantation energy is determined taking into account the ion species and the thickness of the second inter-layer film 42, and it may be necessary to select the implantation energy so as prevent punch-through of the ions into the first inter-layer film 41. For instance, in implanting Ge ions into the second inter-layer film 42 having a thickness of 75 nm, the implantation energy is set to 55 keV, for example. As a result, the stress in the ion-implanted second inter-layer film 43 is lowered to 0 or nearly to 0. At least, the resultant stress of the stress in the first inter-layer film 41 and the stress in the ion-implanted second inter-layer film 43 becomes a tensile stress.

Subsequently, as shown in FIG. 3G, the resist pattern 52 [see FIG. 3F] is removed. This removing process is carried out by an asher process using an oxygen plasma, for example. As a result of the above, the first inter-layer film 41 having a tensile stress and the stress-relaxed second inter-layer film 43 are formed on the upper side of the NMIS transistor 21, whereas the second inter-layer film 42 having a compressive stress is formed over the PMIS transistor 31. Incidentally, while it is desirable that the stress-relaxed second inter-layer film 43 is a film with a stress of 0, it suffices that the combination of the first inter-layer film 41 and the stress-relaxed second inter-layer film 43 on the upper side thereof is substantially a film having a tensile stress.

Figure 3H:
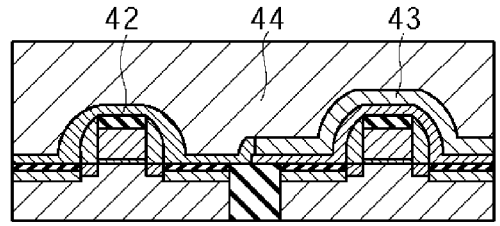

Next, as shown in FIG. 3H, a layer insulation film 44 is formed over the entire surface on the side of the stress-relaxed second inter-layer film 43 and on the side of the second inter-layer film 42 having the compressive stress.

Figure 3I:
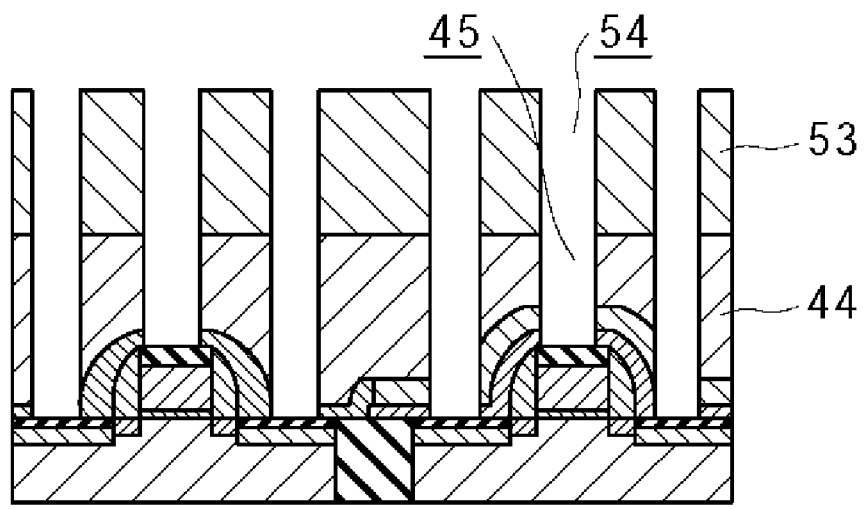

Subsequently, as shown in FIG. 3I, by a lithography process, a resist film 53 is formed on the layer insulation film 44, and then a contact hole pattern 54 is formed. Thereafter, using the resist film 53 as an etching mask, contact holes 45 are formed in the layer insulation film 44 by dry etching. In the drawing, a plurality of contact holes 45 are formed.

Figure 3J:
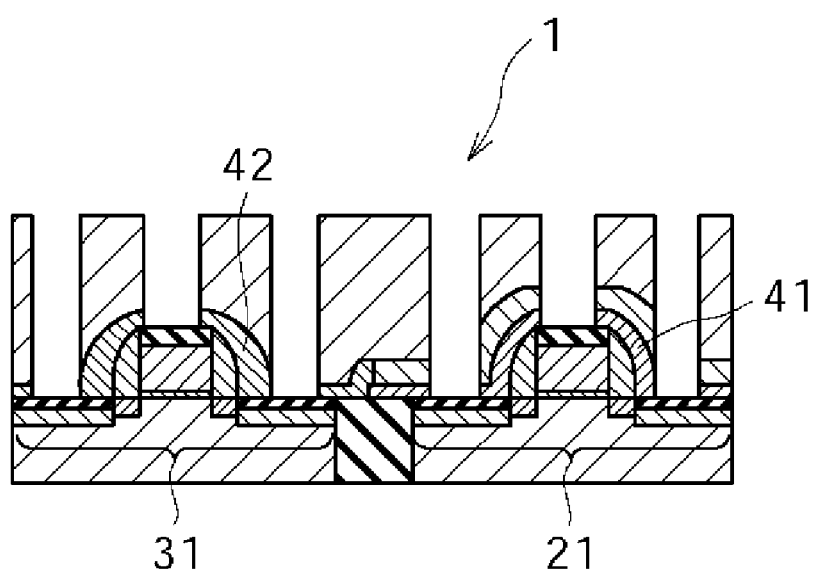

Thereafter, the resist film 53 is removed. This removing process is carried out by an asher process using an oxygen plasma, for example. As a result, as shown in FIG. 3J, the semiconductor device 1 is completed, in which the first inter-layer film 41 having a tensile stress is formed over the NMIS transistor 21, whereas the second inter-layer film 42 having a compressive stress is formed over the PMIS transistor 31.

In the first method of manufacturing a semiconductor device in the present invention, a stopper film used in the related art is not provided between the first inter-layer film 41 having a tensile stress and the second inter-layer film 42 having a compressive stress, so that the problems which arose from the stopper film in the related art are not generated. Therefore, where the layer insulation film 44 is formed on the first inter-layer film 41 having the tensile stress and the second inter-layer film 42 having the compressive stress and the contact holes 45 are formed in the layer insulation film 44, the contact holes 45 showing a high reliability of wiring can be formed. In addition, though the first inter-layer film 41 having a tensile stress and the second inter-layer film 42 having a compressive stress are formed over the N channel MIS type transistor 21, the stress in the second inter-layer film 42 is relaxed. Therefore, an inter-layer film having a tensile stress is substantially formed on the N channel MIS type transistor 21. On the other hand, the second inter-layer film 42 having a compressive stress is formed on the P channel MIS type transistor 31. Therefore, there is obtained the merit that the current drive performance of each of the MIS type transistors can be enhanced. Moreover, there is obtained the advantage that, for carrying out the steps of forming the stress films, it suffices to only form two different stress films.

Now, a second embodiment of the method of manufacturing a semiconductor device in the present invention will be described below, referring to the manufacturing step sectional diagrams shown in FIGS. 4A to 4J. In FIGS. 4A to 4J, the manufacturing steps for the semiconductor device 2 described above referring to FIG. 2 are shown.

Figure 4A:
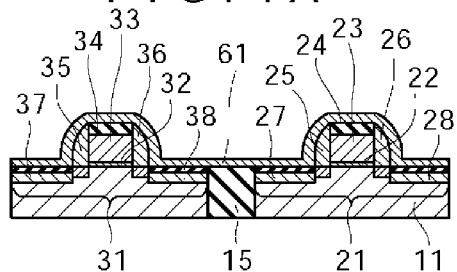
FIGS. 4A to 4J are manufacturing step sectional diagrams showing a second embodiment of the method of manufacturing a semiconductor device in the present invention.

As shown in FIG. 4A, by a known transistor forming technology, a semiconductor substrate (e.g., a silicon substrate) 11 is formed with an N channel MIS type transistor (hereinafter referred to as NMIS transistor) 21 and a P channel MIS type transistor (hereinafter referred to as PMIS transistor) 31, which are isolated from each other by a device isolation region 15.

The NMIS transistor 21 has a configuration as follows. A gate electrode 23 is formed on the upper side of the semiconductor substrate 11, by way of a gate insulation film 22 therebetween, and side wall spacers 25 and 26 are formed on both lateral sides of the gate electrode 23. Incidentally, a silicide layer 24 is formed on the gate electrode 23. Besides, in order that the region of the semiconductor substrate 11 directly below the gate electrode 23 becomes a channel forming region, source/drain regions 27 and 28 composed of N type regions are formed in the semiconductor substrate 11 on both lateral sides of the channel forming region. Incidentally, an extension structure may be adopted in which the regions directly below the side wall spacers 25 and 26 become N type regions of shallower junction than that of the source/drain regions 27 and 28.

The PMIS transistor 31 has a configuration as follows. A gate electrode 33 is formed on the upper side of the semiconductor substrate 11, by way of a gate insulation film 32 therebetween, and side wall spacers 35 and 36 are formed on both lateral sides of the gate electrode 33. Incidentally, a silicide layer 34 is formed on the gate electrode 33. Besides, in order that the region of the semiconductor substrate 11 directly below the gate electrode 33 becomes a channel forming region, source/drain regions 37 and 38 composed of P type regions are formed in the semiconductor substrate 11 on both lateral sides of the channel forming region. Incidentally, an extension structure may be adopted in which the regions directly below the side wall spacers 35 and 36 become P type regions of shallower junction than that of the source/drain regions 37 and 38.

Thereafter, by use of a thermal CVD process or a plasma CVD process, a first inter-layer film 61 having a compressive stress is formed. The first inter-layer film 61 having the compressive stress can be composed, for example, of a film containing silicon and nitrogen as main constituents; for instance, a silicon nitride (SiN) film is formed as the first inter-layer film 61 by a thermal CVD process or a plasma CVD process. In this case, the stress possessed by the first inter-layer film 61 is regulated by the film forming conditions such as the film forming temperature, the pressure of the film forming atmosphere, etc. In addition, the current drive performance can be enhanced more as the first inter-layer film 61 is thicker, but too large a film thickness causes side effects such as difficulty in processing for forming contact holes. Therefore, the thickness of the first inter-layer film 61 is desirably in the range of 50 to 100 nm, for example.

Figure 4E:
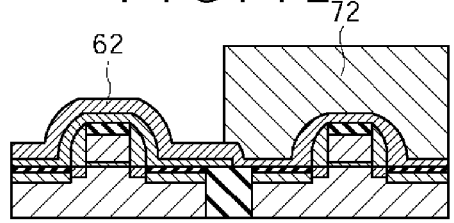
Figure 4B:
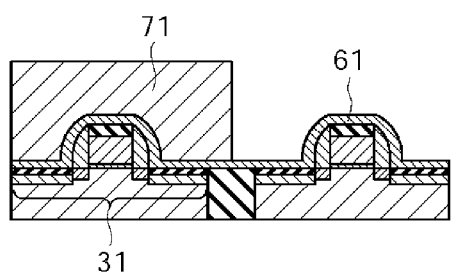

Next, as shown in FIG. 4B, a resist pattern 71 covering the PMIS transistor 31 is formed by a lithography process. Incidentally, where resist exfoliation or collapse or the like is generated under the influence of the under layer, an asher process may be conducted before the lithography process so as to oxidize the surface of the first inter-layer film 61 composed of silicon nitride.

Figure 4F:
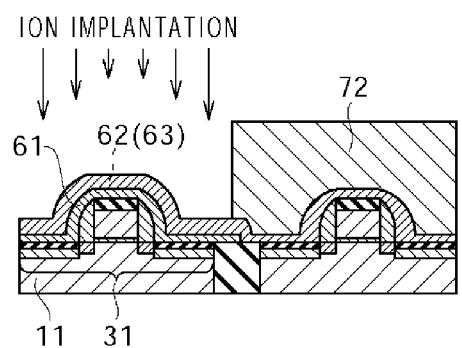
Figure 4C:
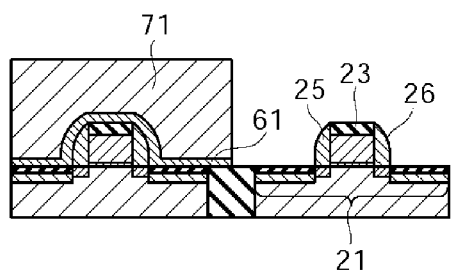

Subsequently, as shown in FIG. 4C, using the resist pattern 71 as an etching mask, the first inter-layer film 61 having a compressive stress present over the NMIS transistor 21 is removed. This removing process is carried out by dry etching, for example. In determining the conditions of the dry etching, it may be necessary to prevent the problem that the un-etched residue of the first inter-layer film 61 having the compressive stress might remain in the periphery of the side wall spacers 25 and 26 formed on side portions of the gate electrode 23 of the NMOS transistor 21, thereby possibly canceling the effects of a second inter-layer film having a tensile stress to be formed later. Therefore, it is desirable to select isotropic etching. Thereafter, the resist pattern 71 is removed. This removing process is carried out by an asher process using an oxygen plasma, for example.

Figure 4G:
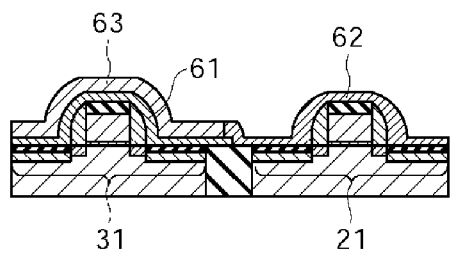
Figure 4D:
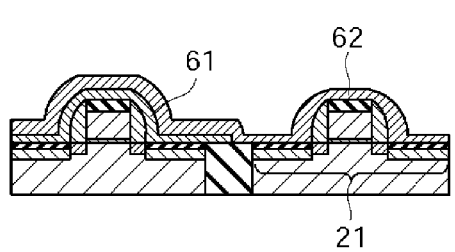

Next, as shown in FIG. 4D, by a thermal CVD process or a plasma CVD process, the second inter-layer film 62 having a tensile stress is formed so as to cover the whole surface on the side of the NMIS transistor 21. The second inter-layer film 62 can be composed, for example, of a film containing silicon and nitrogen as main constituents; for example, a silicon nitride (SiN) film having a compressive stress is formed as the second inter-layer film 62. In this case, the stress possessed by the second inter-layer film 62 is regulated by the film forming conditions such as the film forming temperature, the pressure of the film forming atmosphere, etc. In addition, like in the case of the first inter-layer film 61 having the compressive stress, the current drive performance can be enhanced more as the second inter-layer film 62 is thicker, but too large a film thickness causes side effects such as difficulty in processing for forming contact holes. Therefore, the thickness of the second inter-layer film 62 is desirably in the range of 50 to 100 nm, for example.

Subsequently, as shown in FIG. 4E, a resist pattern 72 covering the NMIS transistor 21 is formed by a lithography process. Incidentally, where resist exfoliation or collapse or the like is generated under the influences of the under layer, an asher process using an oxygen plasma may be conducted before the lithography process so as to oxidize the surface of the second inter-layer film 62 composed of silicon nitride.

Next, as shown in FIG. 4F, in order to relax the stress in the second inter-layer film 62 having the tensile stress present on the PMIS transistor 31, ion implantation is conducted by use of the resist pattern 72 as an ion implantation mask. Since the purpose of the ion implantation is to relax the stress in the second inter-layer film 62, as the ion species there can be used, for example, germanium (Ge) ion, silicon (Si) ion and the like, in view of their great atomic weights and for suppressing the side effects upon their arrival on the semiconductor substrate 11. In addition, as for the ion implantation conditions, the implantation energy is controlled so that the depth at which the concentration of the ion species shows a peak is located in the second inter-layer film 62 to be stress relaxed. Besides, the dose of implantation is selected at such a level as to convert silicon (Si) into its amorphous state. For example, the dose is preferably not less than $1 \times 10^{-14}/cm^2$. The implantation energy is determined taking into account the ion species and the thickness of the second inter-layer film 62, and it may be necessary to select the implantation energy so as prevent punch-through of the ions into the first inter-layer film 61. For instance, in implanting Ge ions into the second inter-layer film 62 having a thickness of 75 nm, the implantation energy is set to 55 keV, for example. As a result, the stress in the ion-implanted second inter-layer film 63 is lowered to 0 or nearly to 0. At least, the resultant stress of the stress in the first inter-layer film 61 and the stress in the ion-implanted second inter-layer film 63 becomes a compressive stress.

Subsequently, as shown in FIG. 4G, the resist pattern 72 [see FIG. 4F] is removed. This removing process is carried out by an asher process using an oxygen plasma, for example. As a result of the above, the first inter-layer film 61 having a compressive stress and the stress-relaxed second inter-layer film 63 are formed on the upper side of the PMIS transistor 31, whereas the second inter-layer film 62 having a tensile stress is formed over the NMIS transistor 21. Incidentally, while it is desirable that the stress-relaxed second inter-layer film 63 is a film with a stress of 0, it suffices that the combination of the first inter-layer film 61 and the stress-relaxed second inter-layer film 63 on the upper side thereof is substantially a film having a compressive stress.

Figure 4H:
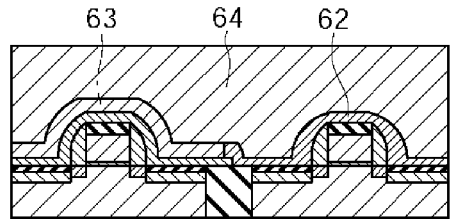

Next, as shown in FIG. 4H, a layer insulation film 64 is formed over the entire surface on the side of the stress-relaxed second inter-layer film 63 and on the side of the second inter-layer film 62 having the tensile stress.

Figure 4I:
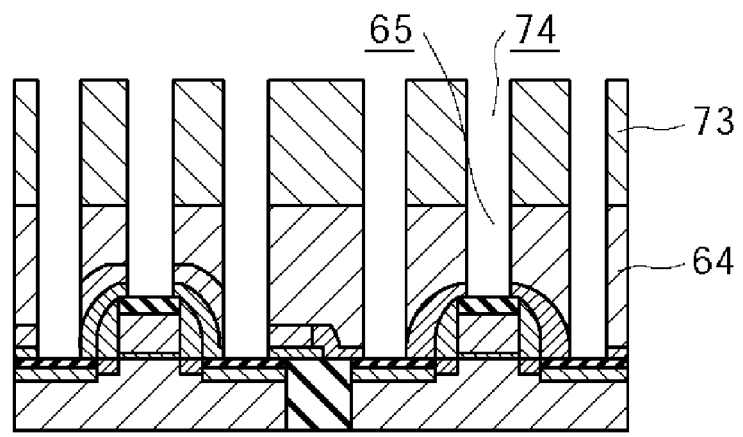

Subsequently, as shown in FIG. 4I, by a lithography process, a resist film 73 is formed on the layer insulation film 64, and then a contact hole pattern 74 is formed. Thereafter, using the resist film 73 as an etching mask, contact holes 65 are formed in the layer insulation film 64 by dry etching. In the drawing, a plurality of contact holes 65 are formed.

Figure 4J:
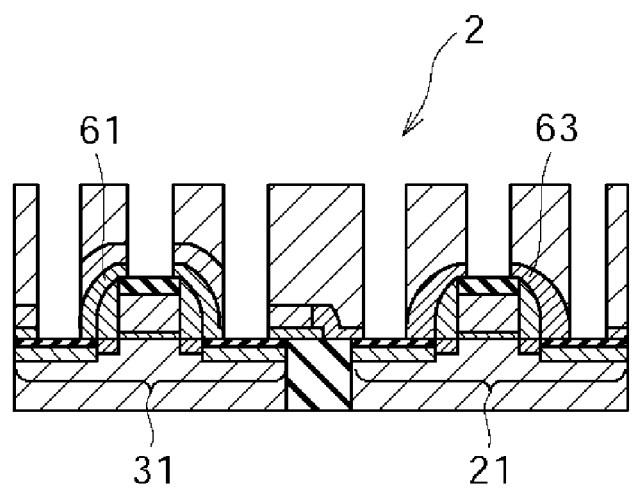

Thereafter, the resist film 73 is removed. This removing process is carried out by an asher process using an oxygen plasma, for example. As a result, as shown in FIG. 4J, the semiconductor device 2 is completed, in which the first inter-layer film 61 having a compressive stress is formed over the PMIS transistor 31, whereas the second inter-layer film 62 having a tensile stress is formed over the NMIS transistor 21.

In the second method of manufacturing a semiconductor device in the present invention, a stopper film used in related art is not provided between the first inter-layer film 61 having a compressive stress and the second inter-layer film 62 having a tensile stress, so that the problems which arose from the stopper film in related art are not generated. Therefore, where the layer insulation film 64 is formed on the first inter-layer film 61 having the compressive stress and the second inter-layer film 62 having the tensile stress and the contact holes 65 are formed in the layer insulation film 64, the contact holes 65 showing a high reliability of wiring can be formed. In addition, though the first inter-layer film 61 having a compressive stress and the second inter-layer film 62 having a tensile stress are formed over the P channel MIS type transistor 31, the tensile stress in the second inter-layer film 62 on the upper side of the first inter-layer film 61 is relaxed. Therefore, an inter-layer film having a compressive stress is substantially formed on the P channel MIS type transistor 31. On the other hand, the second inter-layer film 62 having a tensile stress is formed on the N channel MIS type transistor 21. Therefore, there is obtained the merit that the current drive performance of each of the MIS type transistors can be enhanced. Moreover, there is obtained the advantage that, for carrying out the steps of forming the stress films, it suffices to only form two different stress films.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor device comprising:
   a semiconductor substrate containing silicon;
   an N channel MIS transistor and a P channel MIS transistor therein;
   a first inter-layer film having a tensile stress on said N channel MIS transistor;
   a second inter-layer film, having a non-zero compressive stress, directly on said first inter-layer film and said P channel MIS transistor;
   a layer insulation film on said first inter-layer film having tensile stress and said second inter-layer film having a non-zero compressive stress; and
   a contact hole formed in said layer insulation film,
   wherein,
      said compressive stress in said second inter-layer film is relaxed on the upper side of said first inter-layer film,
      said first inter-layer film has a thickness of 50 to 100 nm,
      said second inter-layer film has a thickness of 50 to 100 nm,
      said compressive stress in said second inter-layer film is relaxed on the upper side of said first inter-layer film by a dose of silicon ion implantation effective to convert the silicon in said semiconductor substrate into its amorphous state.

2. A semiconductor device comprising:
   a semiconductor substrate containing silicon;
   an N channel MIS transistor and a P channel MIS transistor therein;
   a first inter-layer film having a compressive stress on said P channel MIS transistor;
   a second inter-layer film, having a non-zero tensile stress, directly on said first inter-layer film and said N channel MIS transistor;
   a layer insulation film on said first inter-layer film having compressive stress and said second inter-layer film having a non-zero tensile stress; and
   a contact hole formed in said layer insulation film,
   wherein,
      said tensile stress in said second inter-layer film is relaxed on the upper side of said P channel MIS transistor,
      said first inter-layer film has a thickness of 50 to 100 nm,
      said second inter-layer film has a thickness of 50 to 100 nm,
      said compressive stress in said second inter-layer film is relaxed on the upper side of said first inter-layer film by a dose of silicon ion implantation effective to convert the silicon in said semiconductor substrate into its amorphous state.

* * * * *